United States Patent

Lin et al.

[11] Patent Number: 6,162,678
[45] Date of Patent: Dec. 19, 2000

[54] SIMPLE SMALL FEATURE SIZE BIT LINE FORMATION IN DRAM WITH RTO OXIDATION

[75] Inventors: Kevin Lin, Taipei Hsien; Ching-Chiao Hao; Kun-Chi Lin, both of Hsinchu, all of Taiwan

[73] Assignee: United Microelectronics Corp., Hsinchu, Taiwan

[21] Appl. No.: 09/188,916

[22] Filed: Nov. 9, 1998

[51] Int. Cl.[7] .................................................. H01L 21/8242
[52] U.S. Cl. ........................ 438/253; 438/396; 438/652; 438/657
[58] Field of Search ..................................... 438/256, 262, 438/265, 286, 583, 592, 630, 652, 657, 253, 396

[56] References Cited

U.S. PATENT DOCUMENTS 5,956,594  9/1999  Yang et al. .............................. 438/396
5,981,330  9/1999  Jenq ........................................ 438/238
5,981,334  11/1999  Chien et al. ............................ 438/253

*Primary Examiner*—Charles Bowers
*Assistant Examiner*—Jack Chen
*Attorney, Agent, or Firm*—Hickman Coleman & Hughes, LLP

[57] ABSTRACT

A method for fabricating a type of bit line is able to form a small-sized bit line. In this method a first dielectric layer, a first conductive layer, and a second conductive layer are formed on a substrate in sequence. The first dielectric layer is exposed, then a second conducting wire and a first conducting wire are formed, respectively. A portion of the second conducting wire is removed by a cleaning liquid, so that the feature size of the second conducting wire is less than the feature size of the first conducting wire. An oxide layer is formed on the second conducting wire and the first conducting wire by performing a thermal treatment. The feature size of the second conducting wire is approximately equal to the feature size of the first conducting wire.

16 Claims, 2 Drawing Sheets

SIMPLE SMALL FEATURE SIZE BIT LINE FORMATION IN DRAM WITH RTO OXIDATION

BACKGROUND OF THE INVENTION

1. Field of the Invention

The present invention relates to a method of fabricating a bit line. More particularly, the present invention relates to a method of fabricating a bit line used in ULSI.

2. Description of the Related Art

A memory is a semiconductor device used to store information or data. In the storage of the digital information, the memory capability of a memory device is measured in units of a "bit". Each unit for storing information in the memory is called a memory cell. The memory cells are typically arranged in a matrix corresponding to a set of two coordinates such as (column, row). Each coordinate set represents the unique address of a memory cell. The memory cells located in the same column or the same row are connected by the same conducting wires. While transverse conducting wires connected to the memory cells located in the rows are called word lines, the longitudinal conducting wires for data transmission are called bit lines.

The conventional bit lines are made of doped polysilicon and tungsten silicide. The method of fabricating conventional bit lines is to form a dielectric layer on a substrate to isolate the bit lines and the substrate. A metal is replaced by polysilicon because the adhesion between the metal and the silicon is poor. However, even the polysilicon is doped to increase conductivity thereof, the resistivity of the polysilicon is still high. A silicide layer is thus formed on the polysilicon layer to take advantage of the better conductivity of the silicide. The conducting wires are the conductive layers formed by the polysilicon layer and the silicide layer. The bit lines are formed by a photolithography process, after which the bit lines are covered a dielectric layer. The bit lines are isolated from other devices.

As the integration of semiconductors is increased, the size of the devices is reduced. For example, the feature size of the bit line should be below 0.15 $\mu$m for fabricating 0.21 $\mu$m DRAM. Because of the limitations imposed by photoresist resolution, it is difficult to achieve the object by conventional photolithography processes unless a more advanced stepper machine is used. However, manufacturing costs will be increased by changing to the advanced stepper machine.

SUMMARY OF THE INVENTION

It is therefore an objective of the present invention to provide a method for fabricating a kind of bit line whose feature size is below 0.15 $\mu$m by using conventional process facilities.

To achieve these and other advantages and in accordance with the purpose of the invention, as embodied and broadly described herein, the invention provides a method for fabricating a bit line. The method for fabricating this bit line includes the following steps. A first dielectric layer, a first conductive layer, and a second conductive layer are formed on a substrate in sequence. The first dielectric layer is exposed by removing a portion of the second conductive layer and a portion of the first conductive layer, and a second conducting wire and a first conducting wire are formed, respectively. A portion of the second conducting wire is removed by a cleaning liquid, therefore the feature size of the second conducting wire is less than the feature size of the first conducting wire. An oxide layer is formed surrounding the second conducting wire and the first conducting wire by performing a thermal treatment process. The feature size of the second conducting wire is approximately equal to the feature size of the first conducting wire.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
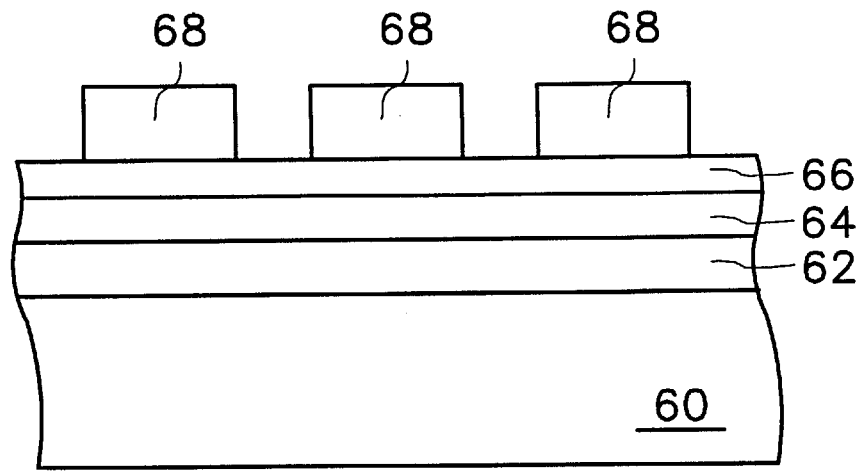
FIGS. 1 through 5 are schematic, cross-sectional diagrams used to depict the steps in a method according to the invention for fabricating a bit line.

Reference will now be made in detail to the present preferred embodiments of the invention, examples of which are illustrated in the accompanying drawings. Wherever possible, the same reference numbers are used in the drawings and the description to refer to the same or like parts.

The invention provides a new fabricating method for a bit line as shown in FIGS. 1 through 5.

Referring to FIG. 1, a first dielectric layer 62 is formed on a provided substrate 60. The first dielectric layer 62 includes silicon oxide, phosphosilicate glass (PSG), borophosphosilicate glass (BPSG), or silicon nitride. Preferably, the first dielectric layer 62 includes silicon oxide formed by chemical vapor deposition. A first conductive layer 64 is formed on the first dielectric layer 62. Preferably, the first conductive layer 64 includes doped polysilicon. The steps of forming the first conductive layer 64 include depositing a polysilicon layer by low-pressure chemical vapor deposition process and doping by ion implantation. A second conductive layer 66 is formed on the first conductive layer 64. Preferably, the second conductive layer 66 includes tungsten silicide. A photoresist layer 68 is formed on the second conductive layer 66. The bit line pattern is transferred onto the photoresist layer 68.

Figure 2:
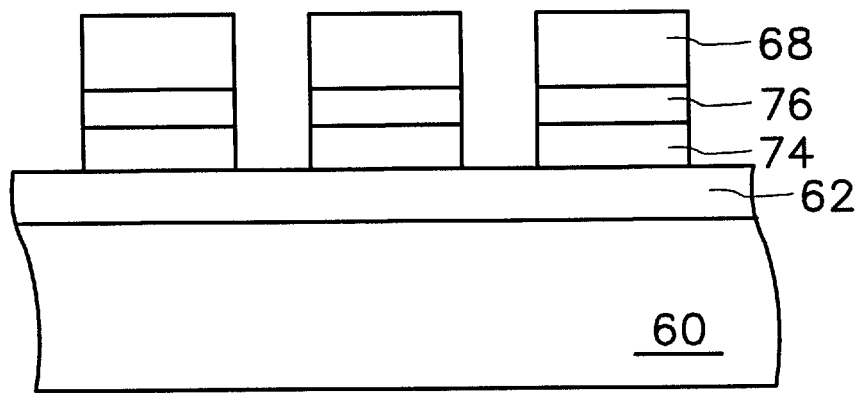

Referring to FIG. 2, a portion of the second conductive layer 66 (FIG. 1) and a portion of the first conductive layer 64 (FIG. 1) are removed in sequence by using the photoresist layer 68 as a mask. The first dielectric layer 62 is exposed, and a second conducting wire 76 and a first conducting wire 74 are formed. An anisotropic etching process is performed to remove the second conductive layer 66 and the first conductive layer 64 by using, for example, chlorine gas as an etchant.

Figure 3:
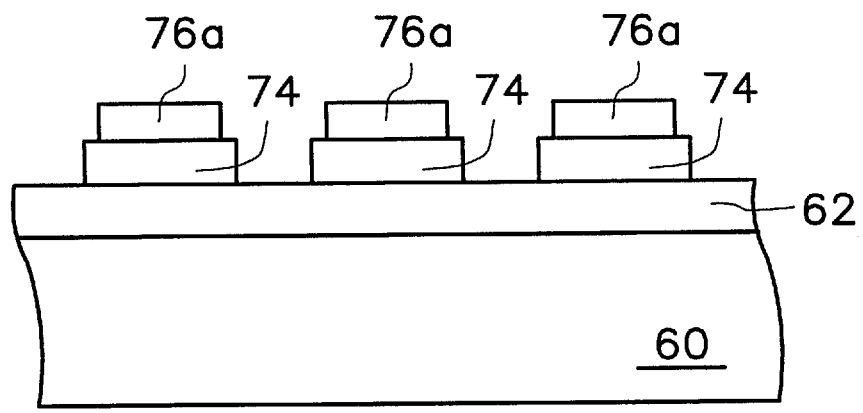

Referring to FIG. 3, the photoresist layer 68 is removed, for example, by oxygen plasma. A portion of the second conducting wire 76 is etched by a cleaning liquid including ammonia and hydrogen peroxide. After the etching step, the feature size of the second conducting wires 76a is thus less than the feature size of the first conducting wires 74.

Figure 4:
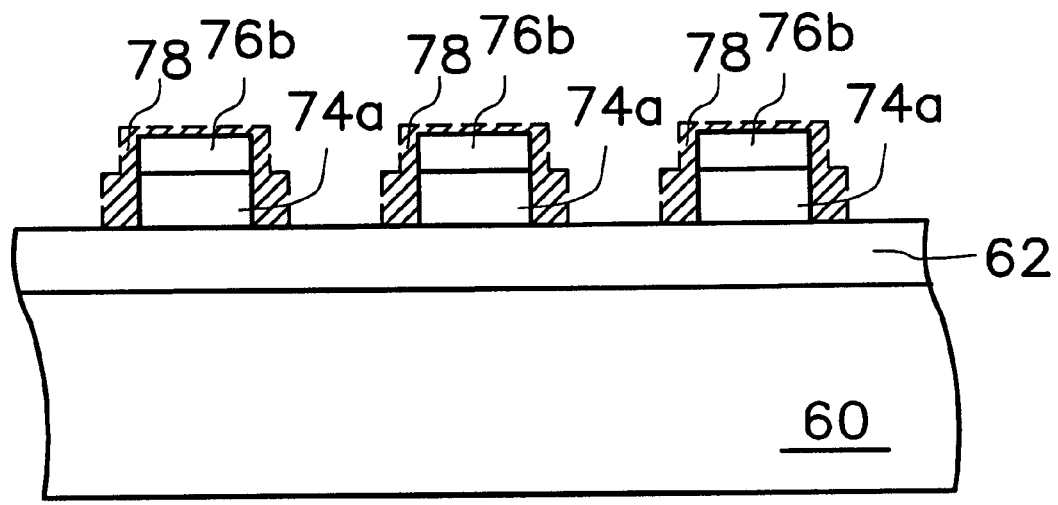

Referring to FIG. 4, the second conducting wire 76a and the first conducting wire 74 are oxidized by performing a thermal treatment, such as rapid thermal oxidation (RTO). The second conducting wire 76b and the first conducting wire 74a are covered by an oxide layer 78. Typically, the oxidation rate of the oxide layer 78 on the second conducting wire 76b is slower than the oxidation rate of the oxide layer 78 forms from the first conducting wire 74a. That is the material of the second conducting wire 76b to be consumed by oxidation for forming the oxide layer 78 is less than the consumption from the first conducting wire 74a. Especially, while the first conducting wire 74a is formed from doped polysilicon and the second conducting wire 76b is formed from silicide, the difference in oxidation rate becomes more obvious. After the oxidation step, the feature size of the second conducting wire 76b is approximately equal to the feature size of the first conducting wire 74a. The oxide layer 78 is removed by hydrofluoric acid, or is remained as kind of dielectric materials.

Figure 5:
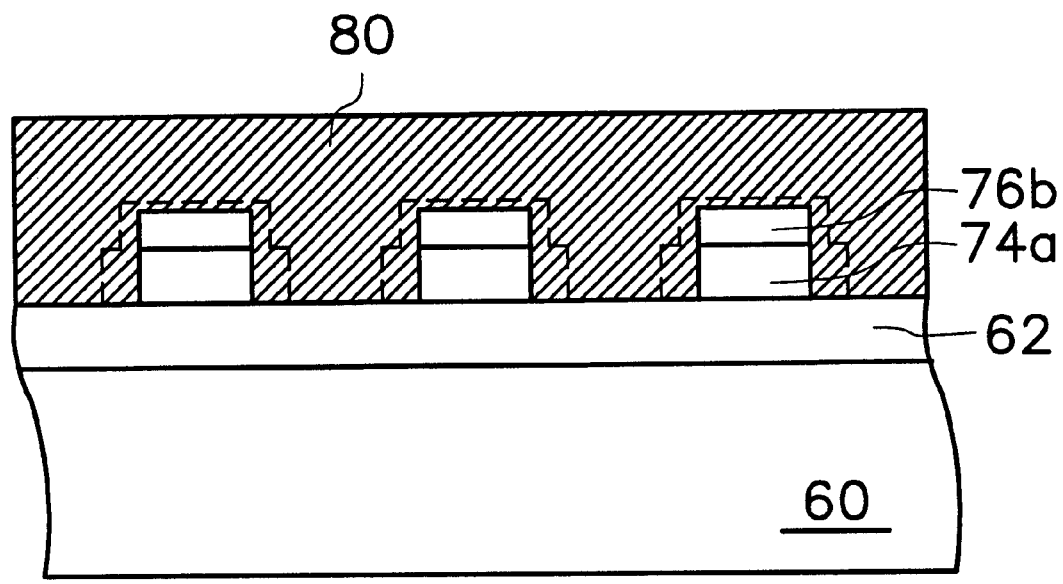

Referring to FIG. 5, a second dielectric layer 80 is formed to cover the second conducting layer 76b, the first conducting layer 74a, and the first dielectric layer 62. The second dielectric layer 80 is thicker than the second conducting wires 76b. The second dielectric layer 80 includes silicon oxide, phosphosilicate glass, borophosphosilicate glass, and silicon nitride. Preferably, the second dielectric layer 80 includes silicon nitride formed by chemical vapor deposition process.

According to the foregoing, the advantage of this invention is that the process is not limited by the resolution of the photolithography process. The feature size of the bit line formed by the conventional method is reduced by performing a thermal treatment process. It is not necessary to utilize a more advanced stepper machine and thus the cost of changing process facilities is avoided.

It will be apparent to those skilled in the art that various modifications and variations can be made to the structure of the present invention without departing from the scope or spirit of the invention. In view of the foregoing, it is introduced that the present invention cover modification and variations of this invention provided they fall within the scope of the following claims and their equivalents.

What is claimed is:

1. A method of fabricating a bit line, comprising the steps of:

providing a substrate;

forming a dielectric layer on the substrate;

forming a first conductive layer on the dielectric layer;

forming a second conductive layer on the first conductive layer;

patterning and removing a portion of the second conductive layer and a portion of the first conductive layer to expose the dielectric layer, and to form a second conducting wire and a first conducting wire, respectively;

removing a portion of the second conducting wire, so that the feature size of the second conducting wire is less than the feature size of the first conducting wire; and performing a thermal treatment process, so that the second conducting wire and the first conducting wire are covered by an oxide layer.

2. The method of claim 1, wherein the first conductive layer includes doped polysilicon.

3. The method of claim 1, wherein the second conductive layer includes tungsten silicide.

4. The method of claim 1, wherein the step of removing the second conducting wire includes wet etching.

5. The method of claim 4, wherein wet etching is performed using a cleaning liquid that includes ammonia and hydrogen peroxide.

6. The method of claim 1, wherein the step of the thermal treatment process includes rapid thermal oxidation.

7. The method of claim 1, further comprising the step of remaining the oxide layer.

8. The method of claim 1, further comprising the step of forming a dielectric layer on the substrate and the second conducting wire.

9. The method of claim 8, wherein the oxide layer becomes a portion of the dielectric layer.

10. A method of fabricating a bit line on a substrate, comprising the steps of:

forming a dielectric layer on the substrate;

forming a first conducting layer on the dielectric layer;

forming a second conductive layer on the first conductive layer;

patterning the first and the second conductive layers into a first conducting wire and a second conducting wire, respectively;

removing a portion of the second conducting wire; and oxidizing surfaces of the first and the second conducting wires into an oxide layer;

wherein the second conductive wire having an oxidation rate is slower than the first conducting wire.

11. The method of claim 10, wherein the first conductive layer includes doped polysilicon.

12. The method of claim 10, wherein the second conductive layer includes tungsten silicide.

13. The method of claim 10, wherein a cleaning liquid includes ammonia and hydrogen peroxide is utilized to remove a portion of the second conducting wire.

14. The method of claim 10, further comprising the step of remaining the oxide layer.

15. The method of claim 10, further comprising the step of forming a dielectric layer on the substrate and the second conducting wire.

16. The method of claim 15, wherein the oxide layer becomes a portion of the dielectric layer.

* * * * *